(12) United States Patent
Rim et al.

(10) Patent No.: US 9,984,029 B2
(45) Date of Patent: May 29, 2018

(54) VARIABLE INTERCONNECT PITCH FOR IMPROVED PERFORMANCE

(71) Applicant: QUALCOMM Incorporated, San Diego, CA (US)

(72) Inventors: Kern Rim, San Diego, CA (US); Stanley Seungchul Song, San Diego, CA (US); Xiangdong Chen, Irvine, CA (US); Raymond George Stephany, Austin, TX (US); John Jianhong Zhu, San Diego, CA (US); Ohsang Kwon, San Diego, CA (US); Esin Terzioglu, San Diego, CA (US); Choh Fei Yeap, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 391 days.

(21) Appl. No.: 14/484,137

(22) Filed: Sep. 11, 2014

(65) Prior Publication Data

US 2015/0301973 A1 Oct. 22, 2015

Related U.S. Application Data

(60) Provisional application No. 61/981,611, filed on Apr. 18, 2014.

(51) Int. Cl.
*H01L 23/528* (2006.01)
*G06F 13/40* (2006.01)
*G06F 13/42* (2006.01)
*G06F 17/50* (2006.01)
*H01L 27/02* (2006.01)

(52) U.S. Cl.
CPC ...... *G06F 13/4068* (2013.01); *G06F 13/4221* (2013.01); *G06F 17/5068* (2013.01); *H01L 27/0207* (2013.01); *G06F 17/5077* (2013.01); *H01L 23/528* (2013.01); *H01L 2924/0002* (2013.01)

(58) Field of Classification Search
CPC ............. G06F 13/4068; G06F 13/4221; G06F 17/5068; H01L 27/0207; H01L 23/528
USPC ............................ 716/55, 119, 139; 257/775
See application file for complete search history.

(56) References Cited

U.S. PATENT DOCUMENTS 4,580,228 A * 4/1986 Noto .................... G06F 17/5072
716/123
4,811,237 A * 3/1989 Putatunda ........... G06F 17/5077
716/127

(Continued)

FOREIGN PATENT DOCUMENTS

JP H09199599 A 7/1997

OTHER PUBLICATIONS

Definition of Intergral multiple Feb. 20, 2013.*

(Continued)

*Primary Examiner* — Paul R Myers
(74) *Attorney, Agent, or Firm* — Seyfarth Shaw LLP

(57) ABSTRACT

A method of designing conductive interconnects includes determining a residual spacing value based at least in part on an integer multiple of a interconnect trace pitch and a designated cell height. The method also includes allocating the residual spacing to at least one interconnect trace width or interconnect trace space within the interconnect trace pitch.

16 Claims, 14 Drawing Sheets

(56) References Cited

U.S. PATENT DOCUMENTS

| | | | | |
|---|---|---|---|---|
| 5,521,837 | A * | 5/1996 | Frankle | G06F 17/5077 716/113 |
| 5,610,833 | A * | 3/1997 | Chang | G06F 17/5036 257/E23.151 |
| 6,018,623 | A * | 1/2000 | Chang | G06F 17/5036 703/19 |
| 6,366,466 | B1 * | 4/2002 | Leddige | H05K 1/0251 174/261 |
| 6,381,166 | B1 | 4/2002 | Yoshida et al. | |
| 7,020,713 | B1 * | 3/2006 | Shah | G06F 9/505 370/395.32 |
| 7,139,987 | B2 * | 11/2006 | Zhang | G06F 17/5068 716/115 |
| 7,276,399 | B1 * | 10/2007 | Hool | H01L 23/49838 257/786 |
| 7,800,136 | B2 | 9/2010 | Shiga | |
| 7,984,410 | B2 | 7/2011 | Chen et al. | |
| 8,276,109 | B2 | 9/2012 | Penzes et al. | |
| 8,295,013 | B1 * | 10/2012 | Pan | G11B 5/4853 360/245.4 |
| 2003/0174475 | A1 * | 9/2003 | Miller | G02B 26/0833 361/760 |
| 2004/0044980 | A1 * | 3/2004 | Juengling | G06F 17/5068 716/51 |
| 2004/0263181 | A1 * | 12/2004 | Ye | G01R 31/2812 324/534 |
| 2005/0285695 | A1 * | 12/2005 | Kim | H01P 3/08 333/33 |
| 2006/0043558 | A1 * | 3/2006 | Cady | H01L 25/105 257/686 |
| 2007/0108589 | A1 * | 5/2007 | Jin | H01L 23/3128 257/700 |
| 2008/0178135 | A1 | 7/2008 | Wu et al. | |
| 2009/0300575 | A1 | 12/2009 | Kornachuk et al. | |
| 2012/0092273 | A1 * | 4/2012 | Lyon | G06F 3/0412 345/173 |
| 2012/0137266 | A1 * | 5/2012 | Hsieh | G06F 17/5077 716/137 |
| 2012/0160548 | A1 * | 6/2012 | Contreras | G11B 5/486 174/257 |
| 2013/0130511 | A1 | 5/2013 | Smayling et al. | |
| 2013/0140707 | A1 * | 6/2013 | Misaka | G06F 17/5072 257/773 |
| 2015/0289366 | A1 * | 10/2015 | Frey | G06F 3/041 174/250 |

OTHER PUBLICATIONS

Direct Performance-driven Placement of Mismatch-sensitive Analog Circuits, Lampaert and Sansen, 1995.*
High Speed Circuit Board Signal Integrity, Stephen C. Thierauf. 2004 Artech House, INC (Year: 2004).*
International Search Report and Written Opinion—PCT/US2015/019050—ISO/EPO—dated Jun. 18, 2015.

* cited by examiner

VARIABLE INTERCONNECT PITCH FOR IMPROVED PERFORMANCE

CROSS-REFERENCE TO RELATED APPLICATION

This application claims the benefit under 35 U.S.C. § 119(e) to U.S. Provisional Patent Application No. 61/981,611, entitled "VARIABLE INTERCONNECT PITCH FOR IMPROVED PERFORMANCE," filed on Apr. 18, 2014, the disclosure of which is expressly incorporated by reference herein in its entirety.

BACKGROUND

Field

Aspects of the present disclosure relate to semiconductor devices, and more particularly to routing conductive layers, such as middle of line layers, within an integrated circuit.

Background

Interconnect layers often connect different devices together on an integrated circuit. Because of the increased density of circuits, the number of conductive layers has increased, and the routing of such layers has become more complex. Further, interconnect traces may not scale well as active device geometries decrease. Although higher density may be achievable, the increased resistance of smaller traces may degrade circuit performance.

SUMMARY

A method of designing conductive interconnects includes determining a residual spacing value based on an integer multiple of an interconnect trace minimum pitch and a designated cell height or a width of a circuit block. The method also includes allocating the residual spacing to at least one interconnect trace width or interconnect trace space within the interconnect trace pitch.

A device includes conductive interconnects within an interconnect cell size. Such a device includes a first interconnect trace width and a first interconnect trace spacing for at least one of the conductive interconnects. The device also includes a second interconnect trace width and/or a second interconnect trace spacing for at least one other of the conductive interconnects. The second interconnect trace width and/or the second interconnect trace spacing is based on a residual space within the interconnect cell size.

A device having a cell size includes means for conducting electrical current having a first width and a first spacing. Such a device further includes means for conducting additional electrical current having a second width and/or a second spacing. The second width and/or the second spacing is based on a residual space within the cell size.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent, however, to those skilled in the art that these concepts may be practiced without these specific details. In some instances, well-known structures and components are shown in block diagram form in order to avoid obscuring such concepts. As described herein, the use of the term "and/or" is intended to represent an "inclusive OR", and the use of the term "or" is intended to represent an "exclusive OR".

Semiconductor fabrication processes are often divided into three parts: a front end of line (FEOL), a middle of line (MOL) and a back end of line (BEOL). Front end of line processes include wafer preparation, isolation, well formation, gate patterning, spacers, and dopant implantation. A middle of line process includes gate and terminal contact formation. The gate and terminal contact formation of the middle of line process, however, is an increasingly challenging part of the fabrication flow, particularly for lithography patterning. Back end of line processes include forming interconnects and dielectric layers for coupling to the FEOL devices. These interconnects may be fabricated with a dual damascene process using plasma-enhanced chemical vapor deposition (PECVD) deposited interlayer dielectric (ILD) materials.

Figure 1:
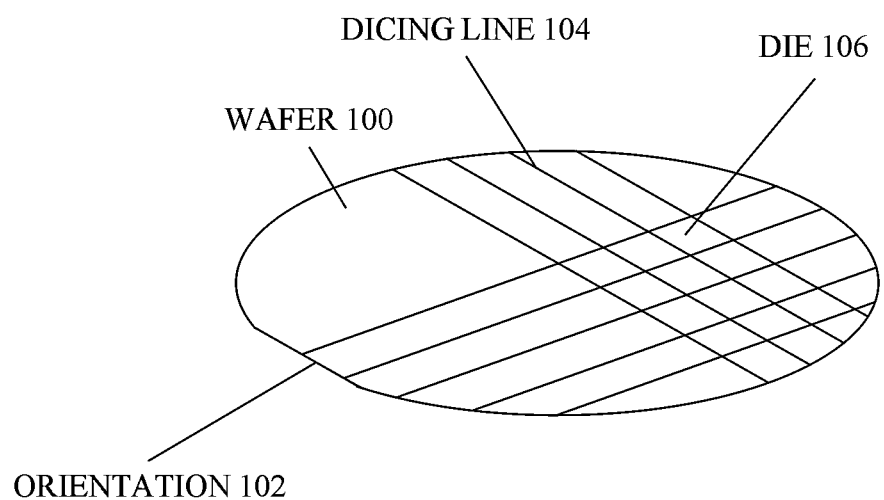
FIG. 1 illustrates a perspective view of a semiconductor wafer in an aspect of the present disclosure.

FIG. 1 illustrates a perspective view of a semiconductor wafer in an aspect of the present disclosure. A wafer 100 may be a semiconductor wafer, or may be a substrate material with one or more layers of semiconductor material on a surface of the wafer 100. When the wafer 100 is a semiconductor material, it may be grown from a seed crystal using the Czochralski process, where the seed crystal is dipped into a molten bath of semiconductor material and slowly rotated and removed from the bath. The molten material then crystalizes onto the seed crystal in the orientation of the crystal.

The wafer 100 may be a compound material, such as gallium arsenide (GaAs), gallium nitride (GaN), a ternary material such as indium gallium arsenide (InGaAs), quaternary materials, or any material that can be a substrate material for other semiconductor materials. Although many of the materials may be crystalline in nature, polycrystalline or amorphous materials may also be used for the wafer 100.

The wafer 100, or layers that are coupled to the wafer 100, may be supplied with materials that make the wafer 100 more conductive. For example, and not by way of limitation, a silicon wafer may have phosphorus or boron added to the wafer 100 to allow for electrical charge to flow in the wafer 100. These additives are referred to as dopants, and provide extra charge carriers (either electrons or holes) within the wafer 100 or portions of the wafer 100. By selecting the areas where the extra charge carriers are provided, which type of charge carriers are provided, and the amount (density) of additional charge carriers in the wafer 100, different types of electronic devices may be formed in or on the wafer 100.

The wafer 100 has an orientation 102 that indicates the crystalline orientation of the wafer 100. The orientation 102 may be a flat edge of the wafer 100 as shown in FIG. 1, or may be a notch or other indicia to illustrate the crystalline orientation of the wafer 100. The orientation 102 may indicate the Miller Indices for the planes of the crystal lattice in the wafer 100.

The Miller indices form a notation system of the crystallographic planes in crystal lattices. The lattice planes may be indicated by three integers h, k, and ℓ, which are the Miller indices for a plane (hkℓ) in the crystal. Each index denotes a plane orthogonal to a direction (h, k, ℓ) in the basis of the reciprocal lattice vectors. The integers are usually written in lowest terms (e.g., their greatest common divisor should be 1). Miller index 100 represents a plane orthogonal to direction h; index 010 represents a plane orthogonal to direction k, and index 001 represents a plane orthogonal to ℓ. For some crystals, negative numbers are used (written as a bar over the index number) and for some crystals, such as gallium nitride, more than three numbers may be desired to adequately describe the different crystallographic planes.

Once the wafer 100 has been processed as desired, the wafer 100 is divided up using dicing lines 104. The wafer 100 may be sawn or otherwise separated into pieces, called die 106. Each of the die 106 may be an integrated circuit with many devices or may be a single electronic device. The physical size of the die 106, which may also be referred to as a chip, depends at least in part on the ability to separate the wafer 100 into certain sizes, as well as the number of individual devices that the die 106 is designed to contain.

Once the wafer 100 has been separated into one or more die 106, the die 106 may be mounted into packaging to allow access to the devices and/or integrated circuits fabricated on the die 106. Packaging may include single in-line packaging, dual in-line packaging, motherboard packaging, flip-chip packaging, indium dot/bump packaging, or other types of devices that access the die 106. The die 106 may also be directly accessed through wire bonding, probes, or other connections without mounting the die 106 into a separate package.

Figure 2:
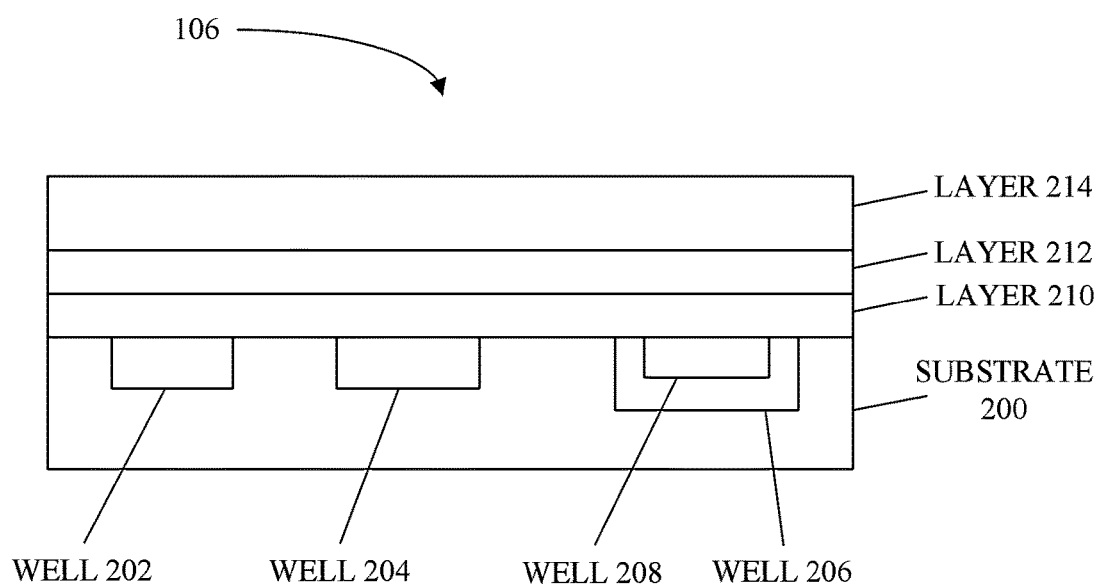
FIG. 2 illustrates a cross-sectional view of a die in accordance with an aspect of the present disclosure.

FIG. 2 illustrates a cross-sectional view of a die in accordance with an aspect of the present disclosure.

In the die 106, there may be a substrate 200, which may be a semiconductor material and/or may act as a mechanical support for electronic devices. The substrate 200 may be a doped semiconductor substrate, which has either electrons (designated n-type) or holes (designated p-type) charge carriers present throughout the substrate 200. Subsequent doping of the substrate 200 with charge carrier ions/atoms may change the charge carrying capabilities of the substrate 200.

Within a substrate 200 (e.g., a semiconductor substrate), there may be wells 202 and 204, which may be the source and/or drain of a field-effect transistor (FET), or wells 202 and/or 204 may be fin structures of a fin structured FET (FinFET). Wells 202 and/or 204 may also be other devices (e.g., a resistor, a capacitor, a diode, or other electronic devices) depending on the structure and other characteristics of the wells 202 and/or 204 and the surrounding structure of the substrate 200.

The semiconductor substrate may also have wells 206 and 208. The well 208 may be completely within the well 206, and, in some cases, may form a bipolar junction transistor (BJT). The well 206 may also be used as an isolation well to isolate the well 208 from electric and/or magnetic fields within the die 106.

Layers 210 through 214 may be added to the die 106. The layer 210 may be, for example, an oxide or insulating layer that may isolate the wells 202-208 from each other or from other devices on the die 106. In such cases, the layer 210 may be silicon dioxide, a polymer, a dielectric, or another electrically insulating layer. The layer 210 may also be an interconnection layer, in which case it may comprise a conductive material such as copper, tungsten, aluminum, an alloy, or other conductive or metallic materials.

The layer 212 may also be a dielectric or conductive layer, depending on the desired device characteristics and/or the materials of the layers 210 and 214. The layer 214 may be an encapsulating layer, which may protect the layers 210 and 212, as well as the wells 202-208 and the substrate 200, from external forces. For example, and not by way of limitation, the layer 214 may be a layer that protects the die 106 from mechanical damage, or the layer 214 may be a layer of material that protects the die 106 from electromagnetic or radiation damage.

Electronic devices designed on the die 106 may comprise many features or structural components. For example, the die 106 may be exposed to any number of methods to impart dopants into the substrate 200, the wells 202-208, and, if desired, the layers 210-214. For example, and not by way of limitation, the die 106 may be exposed to ion implantation, deposition of dopant atoms that are driven into a crystalline lattice through a diffusion process, chemical vapor deposition, epitaxial growth, or other methods. Through selective growth, material selection, and removal of portions of the layers 210-214, and through selective removal, material selection, and dopant concentration of the substrate 200 and the wells 202-208, many different structures and electronic devices may be formed within the scope of the present disclosure.

Further, the substrate 200, the wells 202-208, and the layers 210-214 may be selectively removed or added through various processes. Chemical wet etching, chemical mechanical planarization (CMP), plasma etching, photoresist masking, damascene processes, and other methods may create the structures and devices of the present disclosure.

Figure 3:
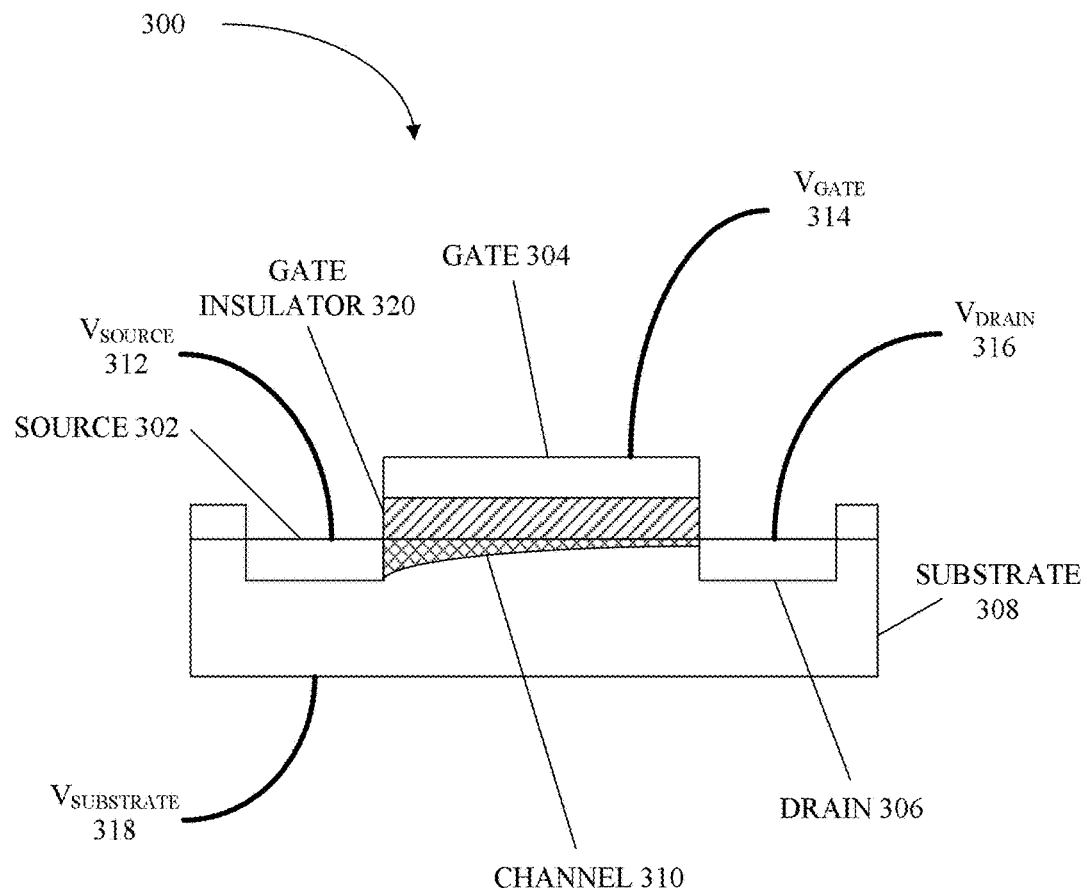
FIG. 3 illustrates a cross-sectional view of a metal-oxide-semiconductor field-effect transistor (MOSFET) device in an aspect of the present disclosure.
Figure 3:
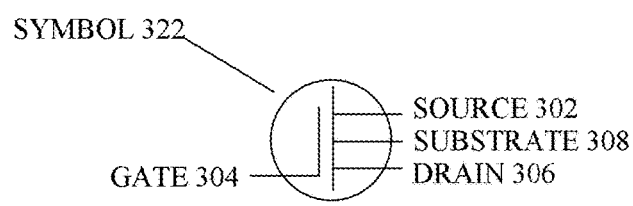

FIG. 3 illustrates a cross-sectional view of a metal-oxide-semiconductor field-effect transistor (MOSFET) device in an aspect of the present disclosure.

A metal-oxide-semiconductor field-effect transistor (MOSFET) 300 may have four input terminals. The four inputs are a source 302, a gate 304, a drain 306, and a substrate 308. The source 302 and the drain 306 may be fabricated as the wells 202 and 204 in the substrate 308, or may be fabricated as areas above the substrate 308, or as part of other layers on the die 106 if desired. Such other structures may be a fin or other structure that protrudes from a surface of the substrate 308. Further, the substrate 308 may be the substrate 200 on the die 106, but substrate 308 may also be one or more of the layers 210-214 that are coupled to the substrate 200.

The MOSFET 300 is a unipolar device, as electrical current is produced by only one type of charge carrier (e.g., either electrons or holes) depending on the type of MOSFET. The MOSFET 300 operates by controlling the amount of charge carriers in the channel 310 between the source 302 and the drain 306. A voltage Vsource 312 is applied to the source 302, a voltage Vgate 314 is applied to the gate 304, and a voltage Vdrain 316 is applied to the drain 306. A separate voltage Vsubstrate 318 may also be applied to the substrate 308, although Vsubstrate 318 may be coupled to one of the other voltages 312-316.

To control the charge carriers in the channel 310, the Vgate 314 creates an electric field in the channel 310 when the gate 304 accumulates charges. The opposite charge to that accumulating on the gate 304 begins to accumulate in the channel 310. The gate insulator 320 insulates the charges accumulating on the gate 304 from the source 302, the drain 306, and the channel 310. The gate 304 and the channel 310 create a capacitor, and as the voltage Vgate 314 increases, eventually enough accumulated charges occur in the channel 310 to provide an electrically conductive path between the source 302 and the drain 306. This condition may be referred to as opening the channel of the FET.

By changing the voltages Vsource 312 and Vdrain 316, and their relationship to the voltage Vgate 314, the amount of voltage applied to the gate 304 to open the channel may vary. For example, the voltage Vsource 312 is usually of a higher potential than that of the voltage Vdrain 316. Making the voltage differential between the voltages Vsource 312 and Vdrain 316 larger will change the amount of the voltage Vgate 314 used to open the channel 310. Further, a larger voltage differential will change the amount of electromotive force moving charge carriers through the channel 310, creating a larger current through the channel 310.

The gate insulator 320 material may be silicon oxide, or may be a dielectric or other material with a different dielectric constant (k) than silicon oxide. Further, the gate insulator 320 may be a combination of materials or different layers of materials. For example, the gate insulator 320 may be Aluminum Oxide, Hafnium Oxide, Hafnium Oxide Nitride, Zirconium Oxide, or laminates and/or alloys of these materials. Other materials for the gate insulator 320 may be used without departing from the scope of the present disclosure.

By changing the material for the gate insulator 320, and the thickness of the gate insulator 320 (e.g., the distance between the gate 304 and the channel 310), the amount of charge on the gate 304 to open the channel 310 may vary. A symbol 322 showing the terminals of the MOSFET 300 is also illustrated. For n-type MOSFETs (using electrons as charge carriers in the channel 310), an arrow is applied to the substrate 308 terminal in the symbol 322 pointing away from the gate 304 terminal. For p-type MOSFETs (using holes as charge carriers in the channel 310), an arrow is applied to the substrate 308 terminal in the symbol 322 pointing toward the gate 304 terminal.

To interconnect to the MOSFET 300, or to interconnect to other devices in a semiconductor die 106, interconnect traces or layers are used. These interconnect traces may be in one or more of layers 210-214, or may be in other layers of the overall die 106.

Some interconnects in semiconductor products may be "unidirectional," in that the traces on a given interconnect level only travel in one direction. For example, one interconnect layer may have traces that run horizontally, and another interconnect layer may have traces that run vertically. The interconnect layers may be connected using vertical interconnections (e.g., vias) such that the traces from the interconnect layers may overlap each other and are only connected at the vertical connection sites.

When semiconductor devices are scaled to smaller geometries, the interconnect traces are also scaled to smaller sizes. This scaling may create problems with the interconnect layers because the resistance of the interconnect traces is inversely proportional to the cross-sectional area of the interconnect trace. As resistance increases, the performance of the overall circuit may change, or degrade, which may affect proper operation of the circuit. As such, scaling the interconnect traces results in a design trade-off between performance of the circuit and the density of the traces that connect the underlying devices.

To create the overall circuit, and to ensure design of an overall circuit, such as a memory or processor, design libraries may be used. These design libraries have pre-organized groups of devices, which may be called cells, where each cell has a specified function such as a memory gate, a group of memory gates, an electromagnetic pulse (EMP) protection device, and other devices.

Circuit designers place various numbers and types of cells together to create the overall circuit. Depending on the cell function, the cell may have different dimensions. One of these dimensions may be referred to as the cell height. The cell height may be dependent upon any number of variables, including the number and types of devices, the overall geometry, and/or the function of the cell, among other things.

The interconnect dimensions, including the width of the interconnect traces, the spacing between the interconnect traces, and the overall cell height of the interconnect trace cell may differ from the cell height to which the interconnect traces connect. Further, the interconnect traces may be designed on a grid pattern within the interconnect cell height to maintain uniformity between interconnections from one type of device cell to another and to maintain device yield within fabrication process tolerances.

Figure 4A:
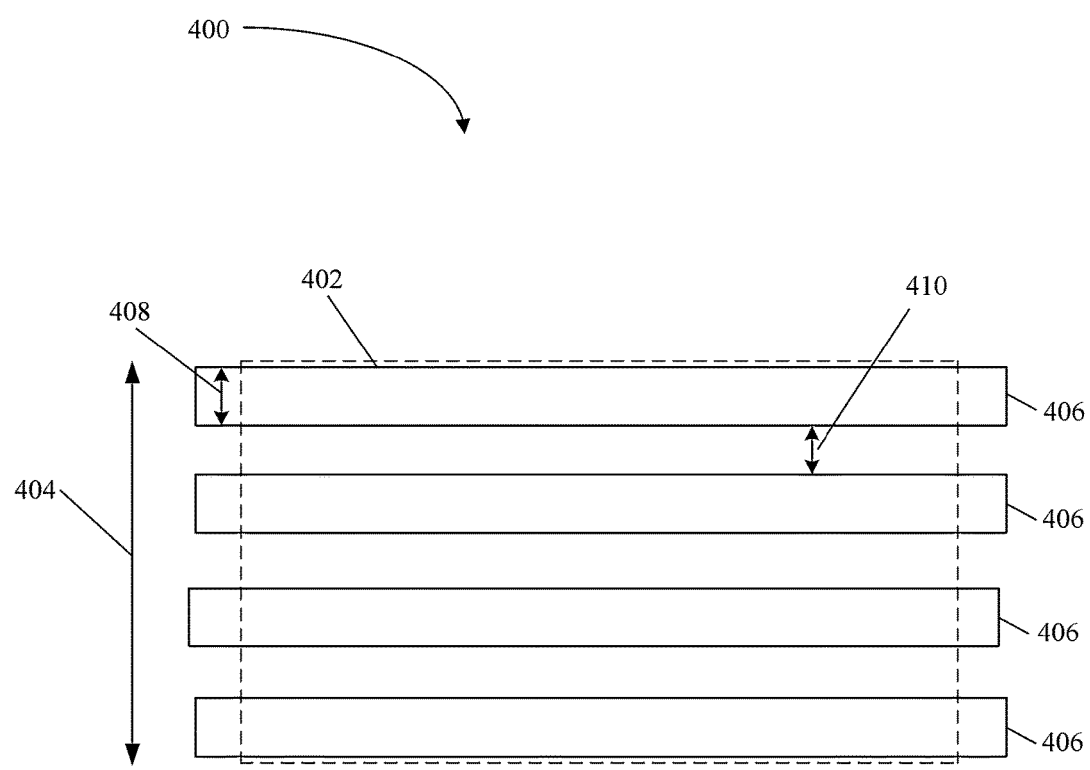
FIGS. 4A and B illustrate interconnect traces in accordance with aspects of the present disclosure.

FIG. 4A illustrates interconnect traces in accordance with an aspect of the present disclosure. An interconnect cell 400 is illustrated with an interconnect cell size 402 that includes a cell height 404. Interconnect traces 406 are arranged within the cell height 404. Each interconnect trace 406 has an interconnect trace width 408; and an interconnect spacing width 410 separates the interconnect traces 406. The combination of the interconnect trace width 408 and an interconnect spacing width 410 may be known as the pitch (e.g., wiring pitch) of the interconnect cell 400.

An integer multiple of the interconnect pitch (e.g., the combination of the interconnect trace width 408 and the interconnect spacing width 410) fits within the cell height 404. For example, and not by way of limitation, in FIG. 4A there are four interconnect traces 406 arranged within the cell height 404 of the interconnect cell size 402. The cell height 404 may be a desired cell size or dimension for an interconnect cell 400, where the cell height 404 is based on the interconnect trace width 408 and the interconnect spacing width 410 (e.g., the interconnect pitch).

The cell height 404 for the interconnect cell 400, however, may not be based solely on the interconnect trace width 408 and the interconnect spacing width 410. For example, and not by way of limitation, the cell height 404 may be based on a number of devices in the circuit that are on a different layer within the circuit, or may be based on other interconnect layers within the circuit. In this scenario, the interconnect trace width 408 and the interconnect spacing width 410 may prohibit the arrangement of the corresponding interconnect traces within the cell height 404.

Figure 4B:
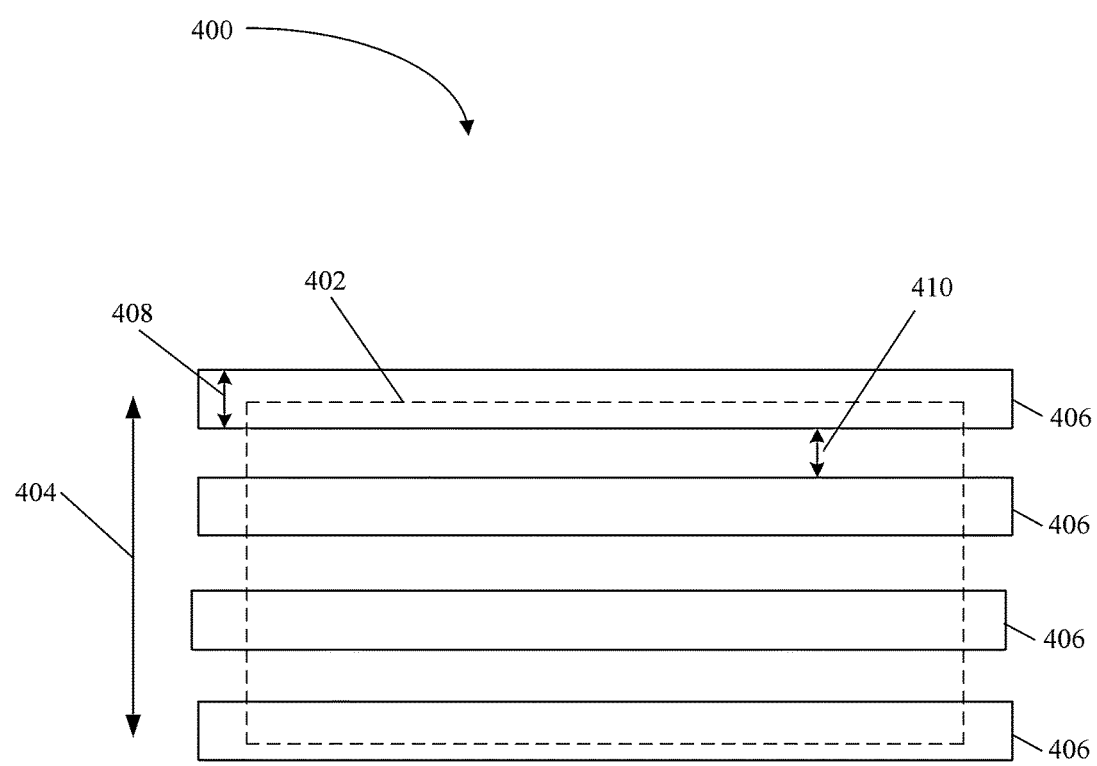

For example, FIG. 4B illustrates an arrangement in which the cell height 404 is not an integer multiple of the minimum interconnect trace width 408 and the interconnect spacing width 410. As a result, the cell height 404, when specified according to a desired or minimum pitch for the interconnect cell 400, is overlapped by the interconnect traces 406. Such overlap or excursion from the cell height 404 makes routing interconnect traces 406 difficult, and may result in poor device yields because of process limitations. Further, such designs may not fall within design guidelines and/or design rules. When the cell height 404 is based on other design considerations, the interconnect cell 400 cell height 404 may be increased to ensure the interconnect traces 406 are properly routed.

For example, as shown in FIG. 4B, two of the four interconnect traces 406 extend beyond the cell height 404. To fit the interconnect traces 406 within the cell height 404, either a smaller number of interconnect traces 406 may be used or the interconnect trace width 408 and/or the interconnect spacing width 410 may be reduced. If the number of interconnect traces 406 are reduced, then fewer devices may be connected, and this may be a limiting feature of the overall circuit design. If the interconnect trace width 408 and/or the interconnect spacing width 410 are reduced, the interconnect traces 406 may violate the process capabilities. For example, if the minimum trace width is 20 nanometers for a certain manufacturing process, the interconnect trace width 408 cannot be designed at 10 nanometers to fit within the cell height 404. In other words, the interconnect cell 400 may require a certain minimum pitch, which may not match the minimum pitch for cell heights of the device layers or other interconnection layers. This creates unused space and/or unused traces in the interconnect cell 400. As such, there will be residual space in the cell height 404 that is unused.

Figure 5A:
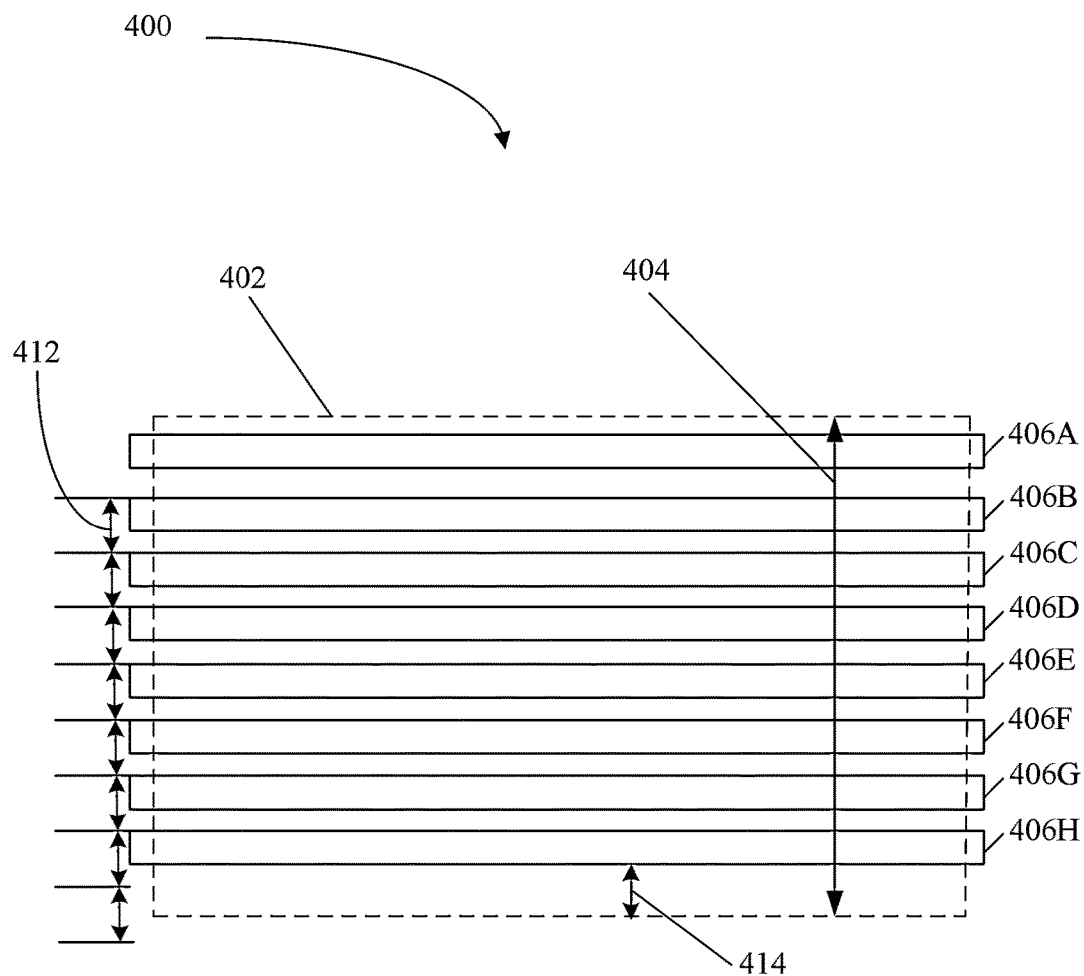
FIGS. 5A-5C illustrate interconnect traces in accordance with aspects of the present disclosure.
Figure 5B:
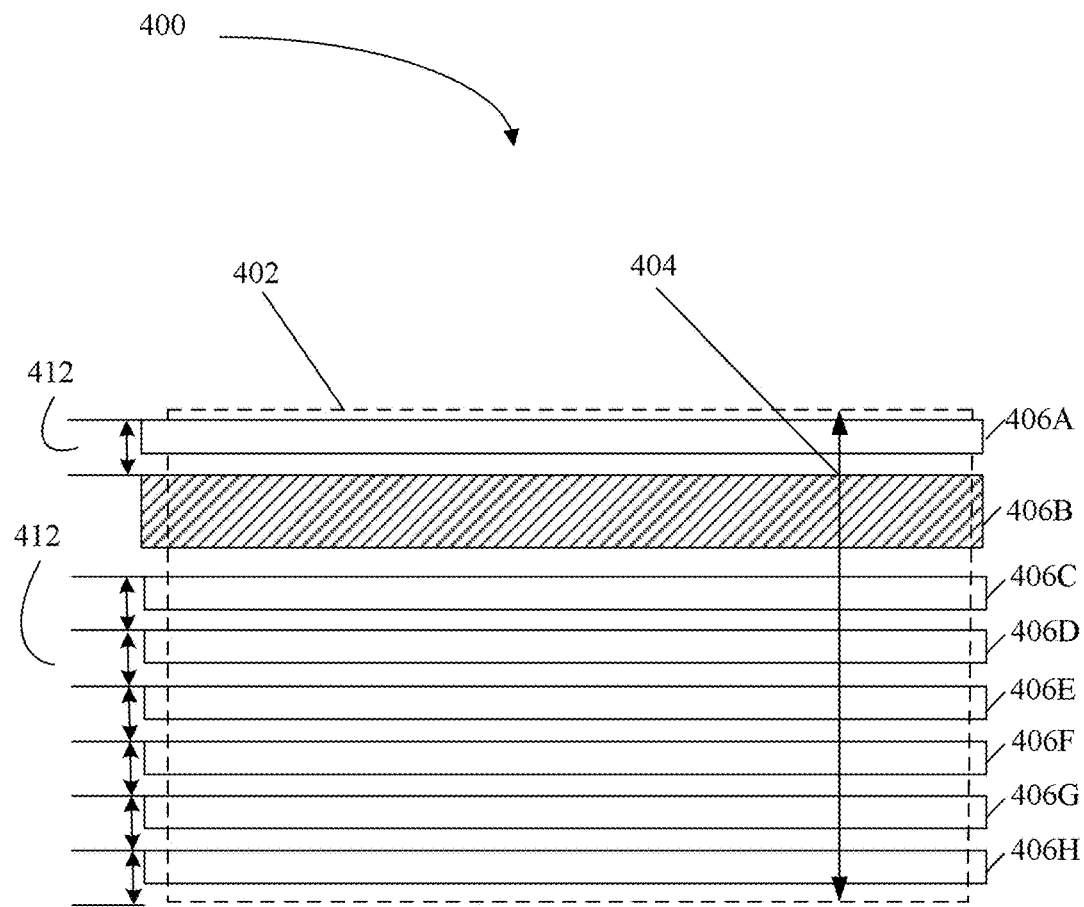
Figure 5C:
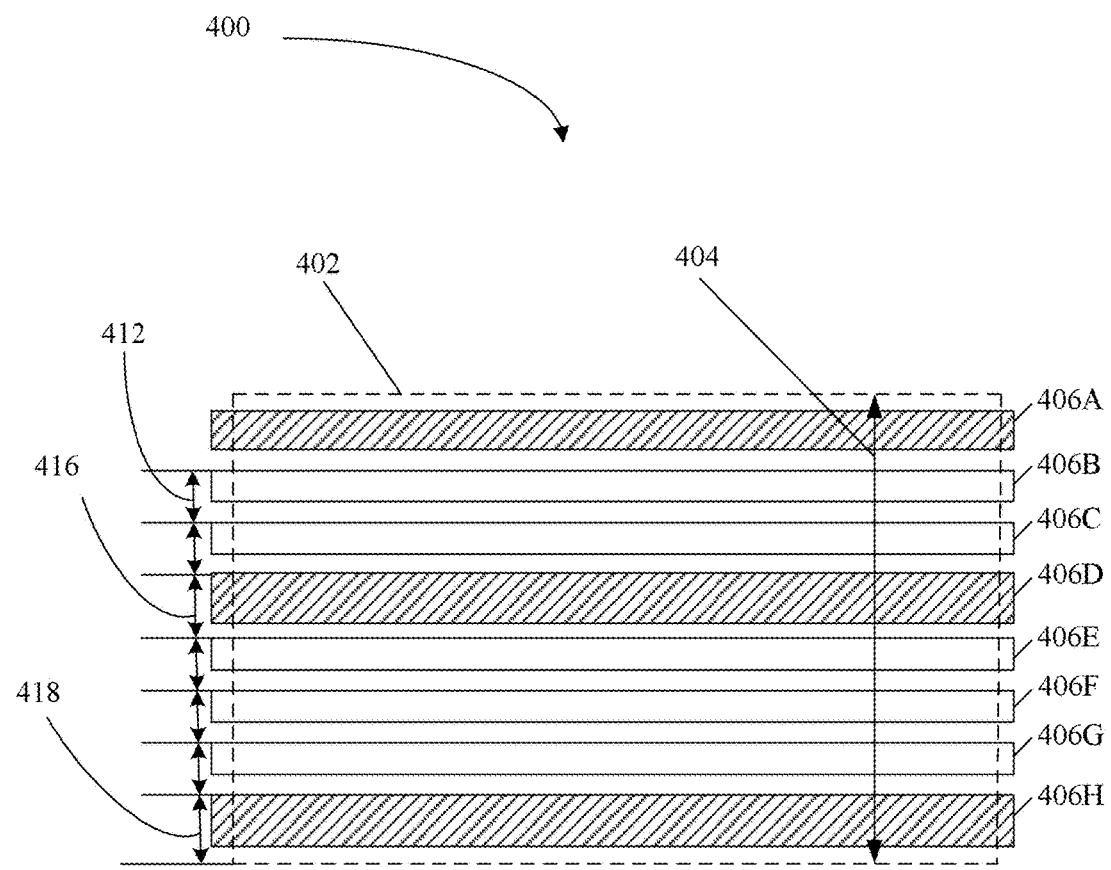

FIGS. 5A-5C illustrate interconnect traces in accordance with aspects of the present disclosure. As in FIG. 4A, the cell height 404 has a number of interconnect traces 406, labeled 406A-406H for clarity, at the interconnect trace pitch 412 for the interconnect traces 406. In FIG. 5A, there is insufficient room in the cell height 404 to include another interconnect trace pitch 412, and, as such, there is a remainder 414 within the cell height 404. The present disclosure, in an aspect, utilizes the remainder by distributing the remainder among one or more of the pre-determined interconnect traces 406.

In other words, the present disclosure distributes the remainder 414 by increasing the interconnect trace width 408 of the predetermined interconnect traces 406 by a certain amount, such that the sum of the interconnect trace widths 408 and interconnect spacing widths 410 of the interconnect traces 406 is exactly the cell height 404. The interconnect traces 406 to be widened may be selected to increase the performance of the circuit or for performance-sensitive routing of the interconnect traces 406.

For example, and not by way of limitation, the remainder 414 may be distributed to a single one of the interconnect traces 406 (e.g. 406A). This configuration is shown in FIG. 5B.

FIG. 5C illustrates distributing the remainder 414 to more than one of the interconnect traces 406 (e.g., 406A, 406D, and 406H). The interconnect trace pitch 412 may now be variable within the cell height 404. Further, the present disclosure is not limited to evenly distributing the remainder 414 to the preselected interconnect traces 406. For example, and not by way of limitation, the interconnect trace 406A may be widened by 5 nanometers, the interconnect trace 406D may be widened by 10 nanometers, and the interconnect trace 406H may be widened by 15 nanometers. Although the present disclosure distributes the remainder 414 of the cell height to one or more interconnect traces 406, the distribution may be an even distribution, an uneven distribution, and/or a distribution to only one of the interconnect traces 406.

Further, rather than distributing the remainder 414 to the interconnect traces 406, the present disclosure may distribute the remainder 414 to the interconnect spacing widths 410 within the interconnect trace pitch 412. The remainder 414 may be distributed to an interconnect spacing width 410 adjacent to one or more of the interconnect traces 406.

In many cell heights 404 for the interconnect traces 406, the cell height 404 is based on another factor that results in a cell height 404 that is not an integer multiple of a value of the interconnect trace pitch 412. To increase ease of interconnection in unidirectional wiring or interconnection schemes, the remainder 414 is often left unused. The present disclosure, in an aspect, utilizes the remainder 414 to increase performance by increasing the interconnect trace 406 width in certain ways to allow the underlying circuitry connected to certain traces to lower resistance within the interconnect traces 406. Such wider interconnect traces 406 may be for power or ground wiring, or for devices where timing or resistance values affect the operation of the device within the circuit design.

Although the interconnect traces 406 may have the interconnect trace width 408 increased for any of the interconnect traces 406, the present disclosure, in an aspect, selects certain interconnect traces 406 as the traces to have the interconnect trace width increased. Further, the increased value of the interconnect trace width 408 of the interconnect traces 406 may be standardized across the interconnect cells 400 for the interconnect traces 406. In this configuration, circuits that may have timing or other performance restraints on interconnect width 408 may be coupled to the interconnect traces 406 that have the interconnect trace width 408 increased within the interconnect cell 400. Because the wider interconnect traces 406 are determined when the interconnect cell 400 is designed, circuit designs and layouts can be improved with the present disclosure. The arrangement to increase the interconnect trace width 408 may be agreed upon and uniform for a set of circuits, so routers can utilize a pre-determined exact placement of the wires during the interconnection portion of the circuit design.

Further, in an aspect of the present disclosure, geometric scaling problems are reduced. Scaling of the interconnect traces increases resistance of the interconnect traces at a faster rate than the increased density provided through geometric scaling. This difference in rate of change between size and resistance of the interconnect traces makes it difficult to realize faster, higher performance devices. The present disclosure reduces that difficulty.

Figure 6:
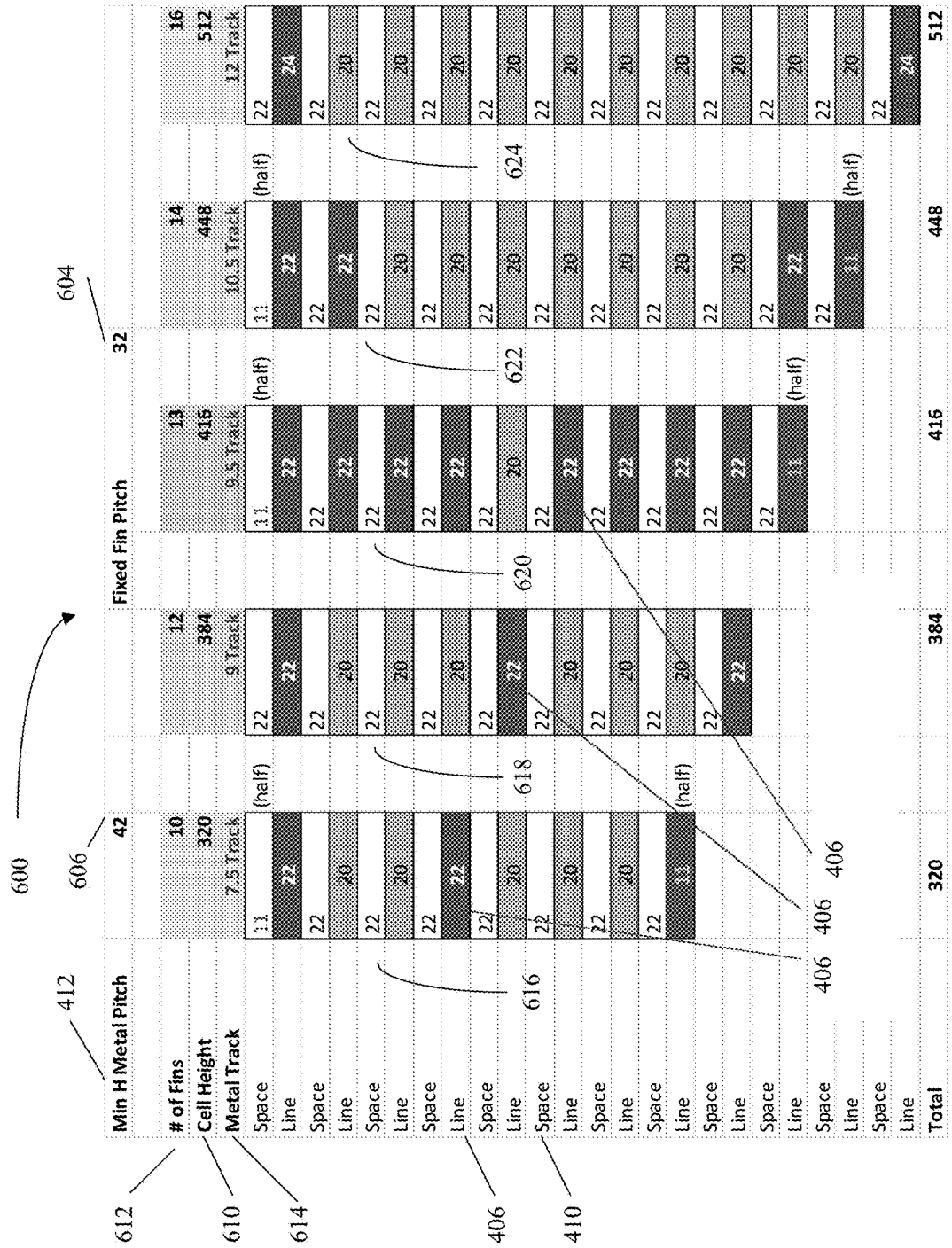
FIG. 6 illustrates configurations of aspects of the present disclosure.

FIG. 6 illustrates possible configurations within an aspect of the present disclosure. A chart 600 illustrates a number of possible design alternatives within the present disclosure. As an example, and not by way of limitation, within a certain geometry a fin pitch, which may be a minimum pitch or a fixed pitch, is given a value 604. In this example, the value 604 is 32 nanometers (nm).

The minimum value of the interconnect trace pitch 412 for the interconnect traces 406, however, may have a different size than the value 604. In this example, the minimum value 606 of the interconnect trace pitch 412 is 42 nm. A device cell height 610 may be determined by an integer number of devices (e.g., fins), which is shown as the device number 612. A number 614 of interconnect traces is then applied to the device cell height 610.

Because the number of devices 612 may vary depending on the device cell size, the device cell height 610 may vary. For example, in a design 616 having ten fins at a pitch value of 32, the device cell height 610 would be 320 nm. In such a design 616, there may be 7.5 interconnect traces within the device cell height 610. Certain interconnect traces 406 within the design 616 may be chosen or pre-determined to have the interconnect trace width 408 increased (e.g., 22 nm instead of 20 nm).

Similarly, designs 618-624 may have a different number of devices 612 which will create different device cell heights 610. As such, a different number of interconnect traces 406 may be included in the device cell height 610, and different interconnect traces 406 may be chosen or pre-determined to have the interconnect trace width 408 increased.

Figure 7:
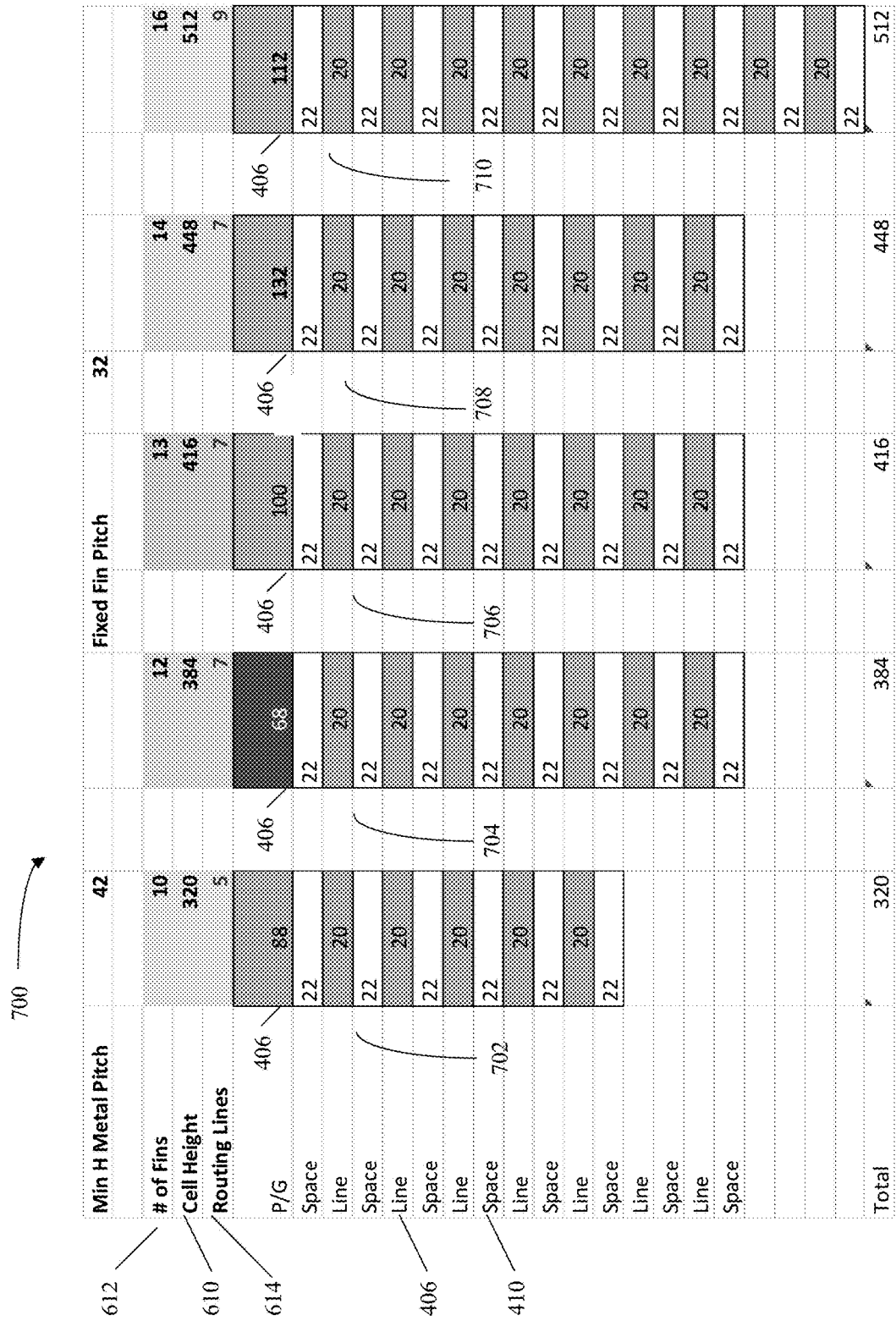
FIG. 7 illustrates additional configurations within an aspect of the present disclosure.
Figure 8:
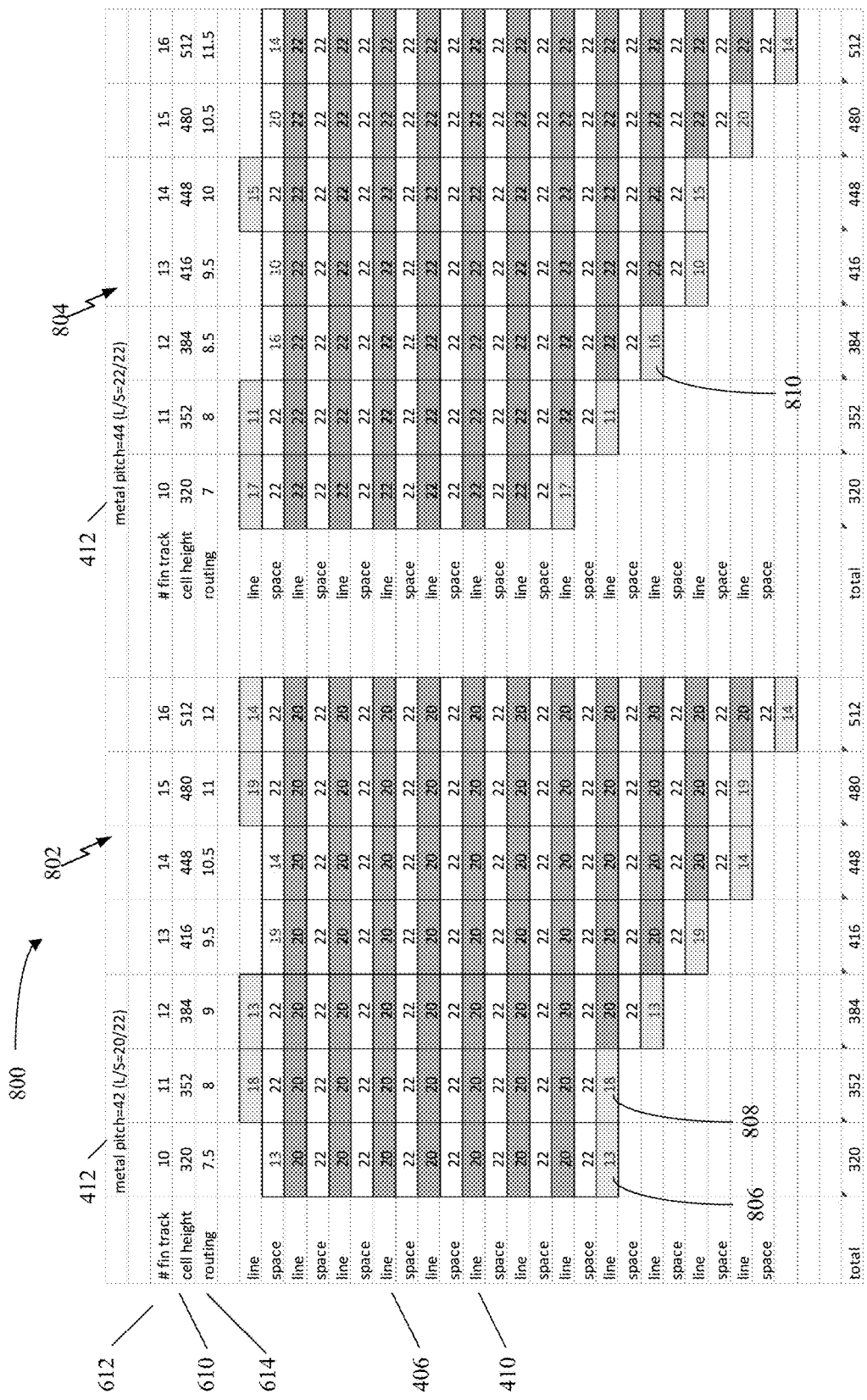
FIG. 8 illustrates additional configurations within an aspect of the present disclosure.

FIG. 7 illustrates additional possible configurations within an aspect of the present disclosure. Chart 700 illustrates a number of possible designs 702-710 within the present disclosure. As an example, and not by way of limitation, a fin pitch value is again 32 nm, and the interconnect trace pitch is 42 nm. However, rather than distributing the remainder 414 throughout certain interconnect traces 406, the remainder 414 is dedicated to a single one of the interconnect traces 406 in designs 702-710. FIG. 8 illustrates additional configurations in accordance with aspects of the present disclosure.

Figure 9:
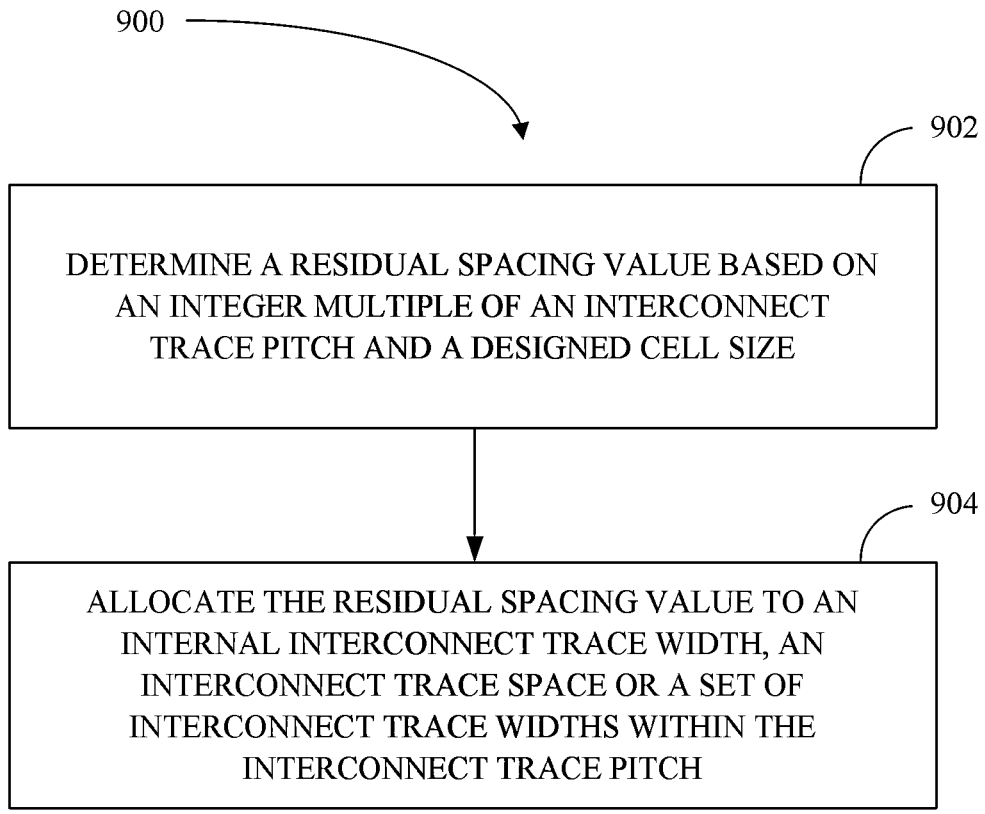
FIG. 9 is a process flow diagram illustrating a process of routing conductive layers within an integrated circuit according to an aspect of the present disclosure.

FIG. 9 is a process flow diagram illustrating a method 900 for designing conductive interconnects according to an aspect of the present disclosure. In block 902 a residual spacing value based on an integer multiple of an interconnect trace pitch and an interconnect cell size is determined. For example, as shown in FIG. 5A, the remainder 414 (e.g., residual spacing value) is determined for the interconnect traces 406 arranged within the interconnect cell size 402 according to the cell height 404. In block 904, the residual spacing value is allocated to at least one interconnect trace width or interconnect trace space of at least a predetermine one of the conductive interconnects within the interconnect trace pitch. For example, as shown in FIG. 5C, the remainder 414 is distributed to more than one of the interconnect traces 406 (e.g., 406A, 406D, and 406H).

According to a further aspect of the present disclosure, a device having a cell size is described. In one configuration, the device includes means for conducting electrical current having a first width and a first spacing. The conducting means may be the interconnect trace 406B as shown in FIG. 5B. In such a configuration, the device also includes means for conducting additional electrical current having a second width and/or a second spacing. The second width and/or the second spacing is based on a residual space within the cell size. The additional conducting means may be the interconnect trace 406A shown in FIG. 5B. In another aspect, the aforementioned means may be any module or any apparatus configured to perform the functions recited by the aforementioned means.

Figure 10:
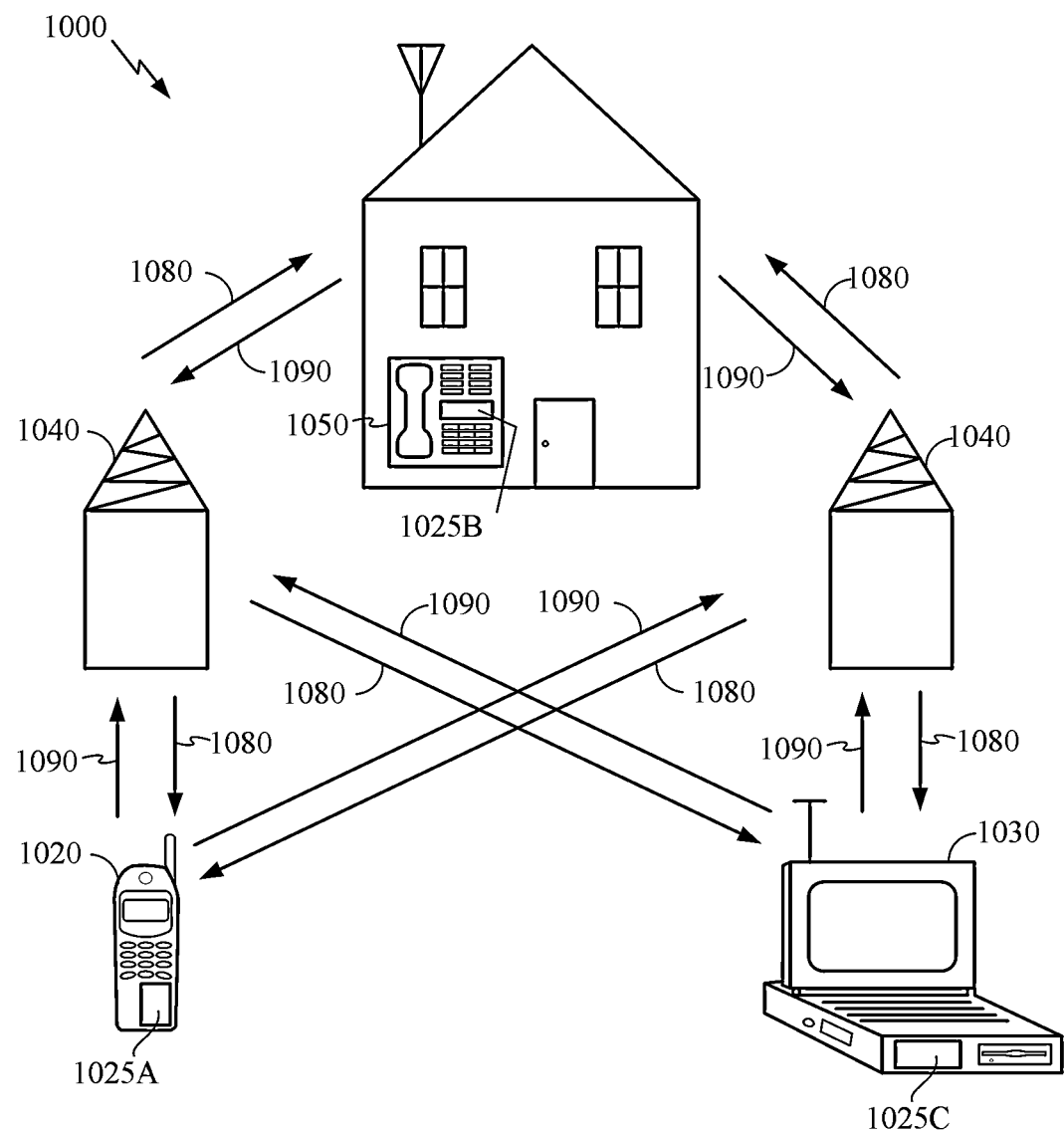
FIG. 10 is a block diagram showing an exemplary wireless communication system in which a configuration of the disclosure may be advantageously employed.

FIG. 10 is a block diagram showing an exemplary wireless communication system 1000 in which an aspect of the disclosure may be advantageously employed. For purposes of illustration, FIG. 10 shows three remote units 1020, 1030, and 1050 and two base stations 1040. It will be recognized that wireless communication systems may have many more remote units and base stations. Remote units 1020, 1030, and 1050 include IC devices 1025A, 1025C, and 1025B that include the disclosed devices. It will be recognized that other devices may also include the disclosed devices, such as the base stations, switching devices, and network equipment. FIG. 10 shows forward link signals 1080 from the base station 1040 to the remote units 1020, 1030, and 1050 and reverse link signals 1090 from the remote units 1020, 1030, and 1050 to base stations 1040.

In FIG. 10, remote unit 1020 is shown as a mobile telephone, remote unit 1030 is shown as a portable computer, and remote unit 1050 is shown as a fixed location remote unit in a wireless local loop system. For example, the remote units may be mobile phones, hand-held personal communication systems (PCS) units, portable data units such as personal data assistants, GPS enabled devices, navigation devices, set top boxes, music players, video players, entertainment units, fixed location data units such as meter reading equipment, or other devices that store or retrieve data or computer instructions, or combinations thereof. Although FIG. 10 illustrates remote units according to the aspects of the disclosure, the disclosure is not limited to these exemplary illustrated units. Aspects of the disclosure may be suitably employed in many devices, which include the disclosed devices.

Figure 11:
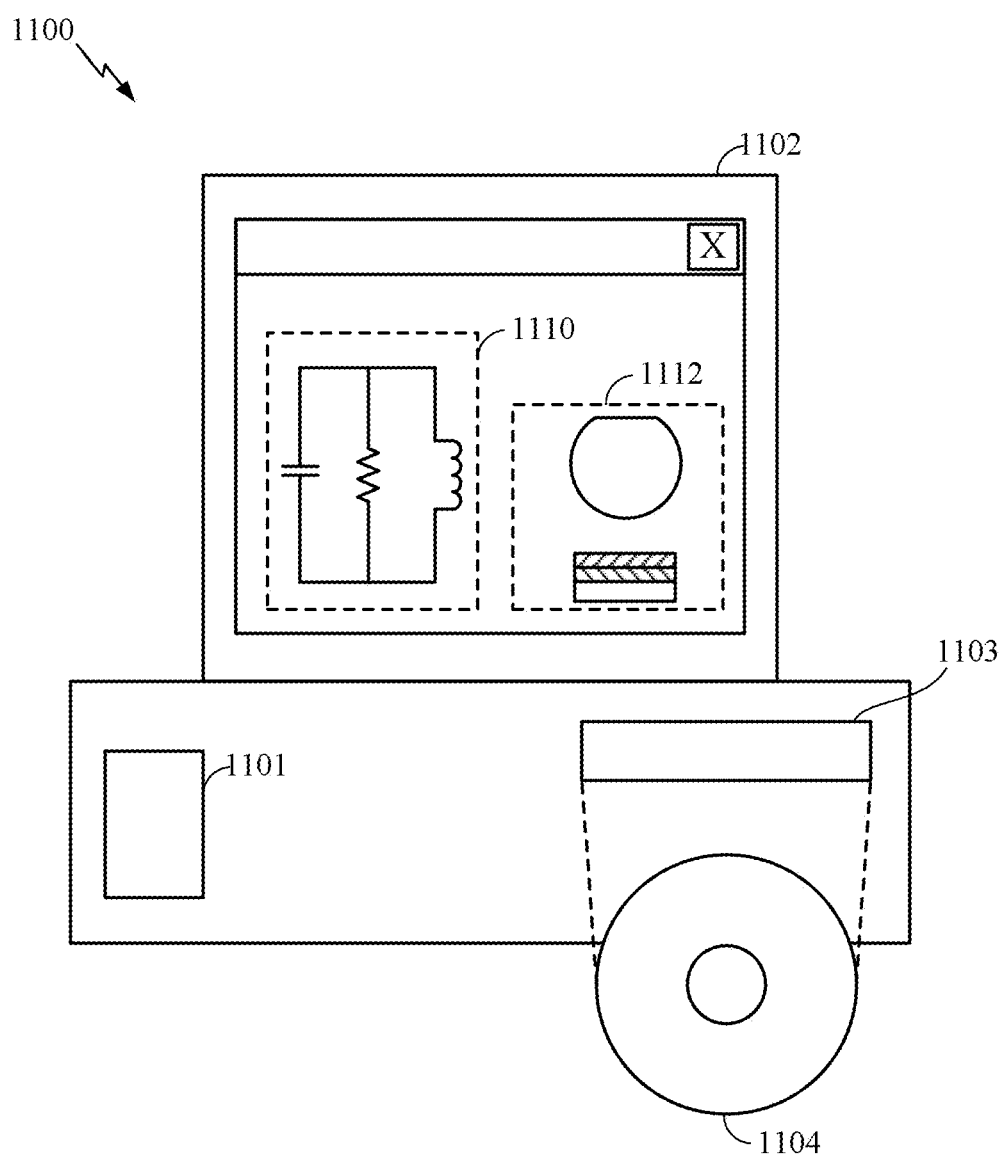
FIG. 11 is a block diagram illustrating a design workstation used for circuit, layout, and logic design of a semiconductor component according to one configuration.

FIG. 11 is a block diagram illustrating a design workstation used for circuit, layout, and logic design of a semiconductor component, such as the devices disclosed above. A design workstation 1100 includes a hard disk 1101 containing operating system software, support files, and design software such as Cadence or OrCAD. The design workstation 1100 also includes a display 1102 to facilitate design of a circuit 1110 or a semiconductor component 1112 such as a device in accordance with an aspect of the present disclosure. A storage medium 1104 is provided for tangibly storing the design of the circuit 1110 or the semiconductor component 1112. The design of the circuit 1110 or the semiconductor component 1112 may be stored on the storage medium 1104 in a file format such as GDSII or GERBER. The storage medium 1104 may be a CD-ROM, DVD, hard disk, flash memory, or other appropriate device. Furthermore, the design workstation 1100 includes a drive apparatus 1103 for accepting input from or writing output to the storage medium 1104.

Data recorded on the storage medium 1104 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 1104 facilitates the design of the circuit 1110 or the semiconductor component 1112 by decreasing the number of processes for designing semiconductor wafers.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

Those of skill would further appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core), or any other such configuration.

The steps of a method or algorithm described in connection with the disclosure may be embodied directly in hardware, in a software module executed by a processor, or in a combination of the two. A software module may reside in RAM, flash memory, ROM, EPROM, EEPROM, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can include RAM, ROM, EEPROM, CD-ROM or other optical disk storage, magnetic disk storage or other magnetic storage devices, or any other medium that can be used to carry or store specified program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein but is to be accorded the widest scope consistent with the principles and novel features disclosed herein.

What is claimed is:

1. A method of arranging a plurality of conductive interconnects within a device cell having a predetermined device function and a device cell size, comprising:
    determining a residual spacing value based at least in part on an integer multiple of an interconnect trace pitch and the device cell size;
    identifying at least one of the plurality of conductive interconnects on a predetermined performance-sensitive route in the device cell; and
    allocating the residual spacing value to an interconnect trace width of the identified at least one of the plurality of conductive interconnects within the device cell, the interconnect trace width of the identified at least one of the plurality of conductive interconnects arranged on the predetermined performance-sensitive route being greater than an interconnect trace width of at least one other of the plurality of conductive interconnects off the predetermined performance-sensitive route and within the device cell of a plurality of device cells.

2. The method of claim 1, in which a set of interconnect trace widths and interconnect trace spacing fill a cell height of the device cell size or fill a width of a circuit block.

3. The method of claim 1, in which allocating the residual spacing value further comprises distributing the residual spacing value evenly among interconnect trace spacing of the plurality of conductive interconnects within a cell height of the device cell size or within a width of a circuit block.

4. The method of claim 1, in which allocating the residual spacing value further comprises distributing the residual spacing value to specific interconnect trace widths of the plurality of conductive interconnects identified on the predetermined performance-sensitive route within a cell height of the device cell size.

5. The method of claim 1, in which allocating the residual spacing value further comprises allocating the residual spacing value to an interconnect trace spacing adjacent the identified at least one of the plurality of conductive interconnects.

6. The method of claim 1, in which the plurality of conductive interconnects are integrated into a mobile phone, a set top box, a music player, a video player, an entertainment unit, a navigation device, a computer, a hand-held personal communication systems (PCS) unit, a portable data unit, and/or a fixed location data unit.

7. A device having conductive interconnects within a device cell having a predetermined device function and a device cell size, comprising:
    a plurality of the conductive interconnects off a predetermined performance sensitive route in the device cell and having a first interconnect trace width and a first interconnect trace spacing, in which a sum of the first interconnect trace width and the first interconnect trace spacing for each of the conductive interconnects does not match the device cell size; and
    at least one other of the conductive interconnects within the device cell and having a second interconnect trace width and a second interconnect trace spacing, the at least one other of the conductive interconnects arranged on the predetermined performance-sensitive route in the device cell of a plurality of device cells, in which the second interconnect trace width is greater than the first interconnect trace width.

8. The device of claim 7, in which a set of interconnect trace widths and interconnect trace spacing fill the device cell size.

9. The device of claim 7, in which space is allocated to an interconnect trace spacing adjacent the at least one other of the conductive interconnects within the device cell size, such that the second interconnect trace spacing is different from the first interconnect trace spacing.

10. The device of claim 7, integrated into a mobile phone, a set top box, a music player, a video player, an entertainment unit, a navigation device, a computer, a hand-held personal communication systems (PCS) unit, a portable data unit, and/or a fixed location data unit.

11. A method of arranging a plurality of conductive interconnects within a device cell having a predetermined device function and a device cell size, comprising:
    the step of determining a residual spacing value based at least in part on an integer multiple of an interconnect trace pitch and the device cell size;
    the step of identifying at least one of the plurality of conductive interconnects on a predetermined performance-sensitive route in the device cell; and
    the step of allocating the residual spacing value to an interconnect trace width of the identified at least one of the plurality of conductive interconnects within the device cell, the interconnect trace width of the identified at least one of the plurality of conductive interconnects arranged on the predetermined performance-sensitive route being greater than an interconnect trace width of at least one other of the plurality of conductive interconnects off the predetermined performance-sensitive route and within the device cell of a plurality of device cells.

12. The method of claim 11, in which a set of interconnect trace widths and interconnect trace spacing fill a cell height of the device cell size or fill a width of a circuit block.

13. The method of claim 11, in which the step of allocating the residual spacing value further comprises the step of distributing the residual spacing value evenly among interconnect trace spacing of the plurality of conductive interconnects within a cell height of the device cell size or within a width of a circuit block.

14. The method of claim 11, in which the step of allocating the residual spacing value further comprises the step of distributing the residual spacing value to specific interconnect trace widths of the plurality of conductive interconnects identified on the predetermined performance-sensitive route within a cell height of the device cell size.

15. The method of claim 11, in which the step of allocating the residual spacing value further comprises the step of allocating the residual spacing value to an interconnect trace spacing adjacent the identified at least one of the plurality of conductive interconnects.

16. The method of claim 11, in which the plurality of conductive interconnects are integrated into a mobile phone, a set top box, a music player, a video player, an entertainment unit, a navigation device, a computer, a hand-held personal communication systems (PCS) unit, a portable data unit, and/or a fixed location data unit.

* * * * *